(12) United States Patent
Xi et al.

(10) Patent No.: US 10,723,749 B2
(45) Date of Patent: Jul. 28, 2020

(54) METAL COMPLEXES CONTAINING ALLYL LIGANDS

(71) Applicant: MERCK PATENT GMBH, Darmstadt (DE)

(72) Inventors: Bin Xi, Somerville, NJ (US); Joby Eldo, Somerville, NJ (US); Charles Dezelah, Somerville, NJ (US); Ravi Kanjolia, Somerville, NJ (US); Guo Liu, Somerville, NJ (US)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/330,610

(22) PCT Filed: Aug. 31, 2017

(86) PCT No.: PCT/EP2017/071927
§ 371 (c)(1),
(2) Date: Mar. 5, 2019

(87) PCT Pub. No.: WO2018/046391
PCT Pub. Date: Mar. 15, 2018

(65) Prior Publication Data
US 2019/0359640 A1    Nov. 28, 2019

Related U.S. Application Data

(60) Provisional application No. 62/385,356, filed on Sep. 9, 2016.

(51) Int. Cl.
*C07F 15/04* (2006.01)
*C23C 16/40* (2006.01)
*C23C 16/455* (2006.01)

(52) U.S. Cl.
CPC ............ *C07F 15/04* (2013.01); *C23C 16/406* (2013.01); *C23C 16/45553* (2013.01)

(58) Field of Classification Search
CPC ...................................................... C07F 15/04
See application file for complete search history.

(56) References Cited

U.S. PATENT DOCUMENTS

2006/0240190 A1   10/2006   Sakai et al.
2010/0286423 A1   11/2010   Hiro et al.
2014/0030436 A1*  1/2014   Knapp ................... C23C 16/18
                                                           427/255.28

FOREIGN PATENT DOCUMENTS

WO    2014/018517 A1    1/2014

OTHER PUBLICATIONS

Becker, Jill S., et al., Highly Conformal Thin Films of Tungsten Nitride Prepared by Atomic Layer Deposition from a Novel Precursor, Chem. Mater., 15:2969-2976 (2003).
(Continued)

*Primary Examiner* — Kelly M Gambetta
(74) *Attorney, Agent, or Firm* — Harness Dickey & Pierce P.L.C.

(57) ABSTRACT

Metal complexes containing substituted allyl ligands and methods of using such metal complexes to prepare metal-containing films are provided.

20 Claims, 7 Drawing Sheets

(56) References Cited

OTHER PUBLICATIONS

Quisenberry, Keith T., et al., Trimethylsilylated Allyl Complexes of Nickel. The Stabilized Bis(π-allyl)nickel Complex [η$^3$-1,3-(SiMe$_3$)$_2$C$_3$H$_3$]$_2$Ni and Its Mono(π-allyl)NiX (X=Br, I) Derivatives, J. Am. Chem. Soc., 127:4376-87 (2005).
Rightmire, Nicholas R., et al., Balancing Adduct Formation and Ligand Coupling with the Bulky Allyl Complexes [1,3-(SiMe$_3$)$_2$C$_3$H$_3$]$_2$M (M=Fe, Co, Ni), Organometallics, 33:5678-85 (2014).
Carlson, Christin N., et al., Metal Allyl Complexes with Bulky Ligands: Stabilization of Homoleptic Thorium Compounds, [(SiMe3)nC3H5.d4Th (n = 1, 2), J. Am. Chem. Soc., 126:10550-551 (2004).
Carlson, Christin N., et al., Homoleptic allyl complexes of chromium with trimethylsilylated ligands. Formation and molecular structure of {[1-(SiMe$_3$)C$_3$H$_4$]$_2$Cr}$_2$, [1,3-(SiMe$_3$]$_2$Cr, and [1,1',3-(SiMe$_3$)$_3$C$_3$H$_2$]$_2$Cr, J. Organmet Chem., 683:191-99 (2003).
Solomon, Sophia A., The coordination chemistry of silyl-substituted allyl ligands, Dalton Trans., 39:2469-83 (2010).
Korean Office Action dated May 16, 2019 issued in Korean Patent Application No. 10-2019-7009829 (with English translation), 5 pages.
Israeli Examination Report dated Sep. 12, 2019 issued in Israeli Patent Application No. 265052 (with English translation), 6 pages.
Japanese Office Action dated Jul.23, 2019 issued in Japanese Patent Application No. 2019-513826 (with English translation), 9 pages.
International Search Report and the Written Opinion of the International Searching Authority dated Jan. 12, 2017 issued in International Patent Application No. PCT/EP2017/071927.

\* cited by examiner

METAL COMPLEXES CONTAINING ALLYL LIGANDS

CROSS-REFERENCE TO RELATED APPLICATIONS

This patent application is a U.S. national stage application under 35 U.S.C. § 371 of International Patent Application No. PCT/EP2017/071927 filed on 31 Aug. 2017, which claims the benefit of U.S. Provisional Patent Application No. 62/385,356 filed on 9 Sep. 2016. The entire disclosures of each of the above recited applications are incorporated herein by reference.

FIELD OF THE INVENTION

The present technology relates generally to metal complexes including two allyl ligands and methods of preparing metal-containing thin films using such metal complexes.

BACKGROUND

Various precursors are used to form thin films and a variety of deposition techniques have been employed. Such techniques include reactive sputtering, ion-assisted deposition, sol-gel deposition, chemical vapor deposition (CVD) (also known as metalorganic CVD or MOCVD), and atomic layer deposition (ALD) (also known as atomic layer epitaxy). CVD and ALD processes are increasingly used as they have the advantages of enhanced compositional control, high film uniformity, and effective control of doping. Moreover, CVD and ALD processes provide excellent conformal step coverage on highly non-planar geometries associated with modern microelectronic devices.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor is then passed over the substrate surface and reacts with the first precursor, forming a second monolayer of film over the first-formed monolayer of film on the substrate surface. This cycle is repeated to create a film of desired thickness.

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Dielectric thin films are also used in microelectronics applications, such as the high-K dielectric oxide for dynamic random access memory (DRAM) applications and the ferroelectric perovskites used in infrared detectors and non-volatile ferroelectric random access memories (NV-FeRAMs). The continual decrease in the size of microelectronic components has increased the need for improved thin film technologies.

Technologies relating to the preparation of nickel-containing thin films (e.g., nickel metal, nickel oxide, nickel nitride) are of particular interest. For example, nickel-containing films have found numerous practical applications in areas such as catalysts, batteries, memory devices, displays, sensors, and nano- and microelectronics. In the case of electronic applications, commercial viable deposition methods using nickel-containing precursors having suitable properties including volatility, reactivity and stability are needed. However, there are a limited number of available nickel-containing compounds which possess such suitable properties. For example, while bis(allyl)nickel, $(C_3H_5)_2Ni$, may have suitable volatility and reactivity, it is known to have very low thermal stability and will decompose above about 20° C. See, for example, Quisenberry, K., et al., *J. Am. Chem. Soc.* 2005, 127, 4376-4387 and Solomon, S., et al. *Dalton Trans.*, 2010, 39, 2469-2483. Accordingly, there exists significant interest in the development of nickel complexes with performance characteristics which make them suitable for use as precursor materials in vapor deposition processes to prepare nickel-containing films. For example, nickel precursors with improved performance characteristics (e.g., thermal stabilities, vapor pressures, and deposition rates) are needed, as are methods of depositing thin films from such precursors.

SUMMARY

According to one aspect, a metal complex of Formula I is provided:

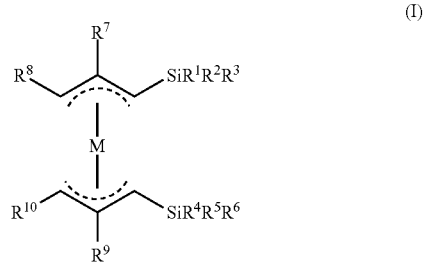

wherein M is selected from the group consisting of nickel, cobalt, iron, ruthenium and manganese; and $R^1$, $R^2$, $R^3$, $R^4$, $R^5$, $R^6$, $R^7$, $R^8$, $R^9$, and $R^{10}$ are each independently hydrogen or $C_1$-$C_5$-alkyl.

In other aspects, a metal complex of Formula II is provided:

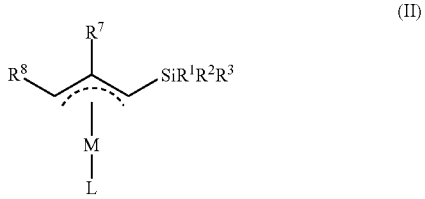

(II)

wherein M is as described herein; $R^1$, $R^2$, $R^3$, $R^7$, and $R^8$ are as described herein; and L is selected from the group consisting of hydrogen, $C_1$-$C_5$-alkyl, $(R^{11})_n$Cp, $NR^{12}R^{13}$, 3,5-$R^{14}R^{15}$—$C_3HN_2$, $Si(SiR^{16}R^{17}R^{18})_3$, and

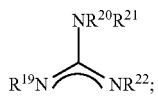

wherein Cp is cyclopentadienyl ring, n is 0-5, and R, $R^{12}$, $R^{13}$, $R^{14}$, $R^{15}$, $R^{16}$, $R^{17}$, $R^{18}$, $R^{19}$, $R^{20}$, $R^{21}$, and $R^{22}$ are each independently hydrogen or $C_1$-$C_5$-alkyl.

In other aspects, methods of forming metal-containing films by vapor deposition, such as CVD and ALD, are provided herein using metal complexes according to Formulas I and II herein.

Other embodiments, including particular aspects of the embodiments summarized above, will be evident from the detailed description that follows.

DETAILED DESCRIPTION

Figure 1:
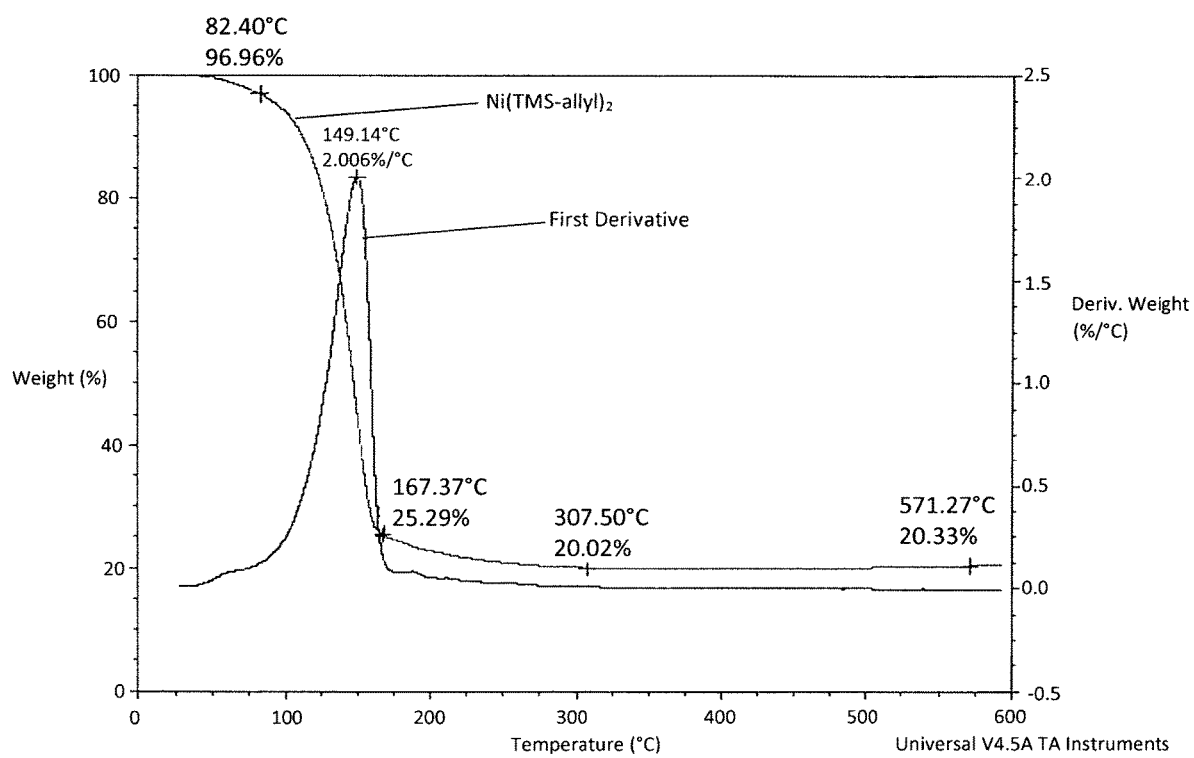
FIG. 1 is a graphical representation of thermal gravimetric analysis (TGA) data demonstrating % weight loss v. temperature of bis-(1-trimethylsilylallyl)nickel(II) (Ni(TMS-allyl)$_2$).

Before describing several exemplary embodiments of the present technology, it is to be understood that the technology is not limited to the details of construction or process steps set forth in the following description. The present technology is capable of other embodiments and of being practiced or being carried out in various ways. It is also to be understood that the metal complexes and other chemical compounds may be illustrated herein using structural formulas which have a particular stereochemistry. These illustrations are intended as examples only and are not to be construed as limiting the disclosed structure to any particular stereochemistry. Rather, the illustrated structures are intended to encompass all such metal complexes and chemical compounds having the indicated chemical formula.

In various aspects, metal complexes, methods of making such metal complexes, and methods of using such metal complexes to form thin metal-containing films via vapor deposition processes, are provided.

As used herein, the terms "metal complex" (or more simply, "complex") and "precursor" are used interchangeably and refer to metal-containing molecule or compound which can be used to prepare a metal-containing film by a vapor deposition process such as, for example, ALD or CVD. The metal complex may be deposited on, adsorbed to, decomposed on, delivered to, and/or passed over a substrate or surface thereof, as to form a metal-containing film. In one or more embodiments, the metal complexes disclosed herein are nickel complexes.

As used herein, the term "metal-containing film" includes not only an elemental metal film as more fully defined below, but also a film which includes a metal along with one or more elements, for example a metal oxide film, metal nitride film, metal silicide film, and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film. In some embodiments, the metal-containing film is an elemental nickel film. In other embodiments, the metal-containing film is nickel oxide, nickel nitride, or nickel silicide film. Such nickel-containing films may be prepared from various nickel complexes described herein.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

The term "alkyl" (alone or in combination with another term(s)) refers to a saturated hydrocarbon chain of 1 to about 12 carbon atoms in length, such as, but not limited to, methyl, ethyl, propyl, butyl, pentyl, hexyl, heptyl, octyl, decyl, and so forth. The alkyl group may be straight-chain or branched-chain. "Alkyl" is intended to embrace all structural isomeric forms of an alkyl group. For example, as used herein, propyl encompasses both n-propyl and isopropyl; butyl encompasses n-butyl, sec-butyl, isobutyl and tert-butyl; pentyl encompasses n-pentyl, tert-pentyl, neopentyl, isopentyl, sec-pentyl and 3-pentyl. Further, as used herein, "Me" refers to methyl, "Et" refers to ethyl, "Pr" refers to propyl, "i-Pr" refers to isopropyl, "Bu" refers to butyl, "t-Bu" refers to tert-butyl, and "Np" refers to neopentyl. In some embodiments, alkyl groups are $C_1$-$C_5$- or $C_1$-$C_4$-alkyl groups.

The term "allyl" refers to an allyl ($C_3H_5$) ligand which is bound to a metal center. As used herein, the allyl ligand has a resonating double bond and all three carbon atoms of the allyl ligand are bound to the metal center in $\eta^3$-coordination by π bonding. Therefore, the complexes of the invention are π complexes. Both of these features are represented by the dashed bonds. When the allyl portion is substituted by one X group, the $X^1$ group replaces an allylic hydrogen to become $[X^1C_3H_4]$; when substituted with two X groups $X^1$ and $X^2$, it becomes $[X^1X^2C_3H_3]$ where $X^1$ and $X^2$ are the same or different, and so forth.

The term "silyl" refers to a —$SiZ^1Z^2Z^3$ radical, where each of $Z^1$, $Z^2$, and $Z^3$ is independently selected from the group consisting of hydrogen and optionally substituted alkyl, alkenyl, alkynyl, aryl, alkoxy, aryloxy, amino, and combinations thereof.

The term "trialkylsilyl" refers to a —$SiZ^4Z^5Z^6$ radical, wherein $Z^5$, $Z^6$, and $Z^7$ are alkyl, and wherein $Z^5$, $Z^6$, and $Z^7$ can be the same or different alkyls. Non-limiting examples of a trialkylsilyl include trimethylsilyl (TMS), triethylsilyl (TES), triisopropylsilyl (TIPS) and tert-butyldimethylsilyl (TBDMS).

Deposition of some metals, including nickel, cobalt, iron, ruthenium and manganese, using metal allyl complexes can be difficult to achieve due to thermal stability issues, being either unstable or too stable for deposition. The organometallic complexes disclosed in the embodiments of the invention allow for control of physical properties as well as provide for increased stability and simple high yield synthesis. As further described herein, the metal complexes may include sterically bulky substituted allyl ligands, such as silyl, trialkylsilyl and/or alkyl substituted allyl ligands, bound to the metal center. While not wishing to be bound by any particular theory, it is believed that such substituted allyl ligands (e.g., trimethylsilyl allyls) result in complexes having suitable volatility and reactivity as well as increased thermal stability. Such complexes may also advantageously be in liquid form with increased solubility in organic solvents. In this regard, metal complexes of such substituted allyl ligands are excellent candidates for preparation of thin metal-containing films in various vapor deposition processes.

Therefore, according to one aspect, a metal complex of Formula I is provided:

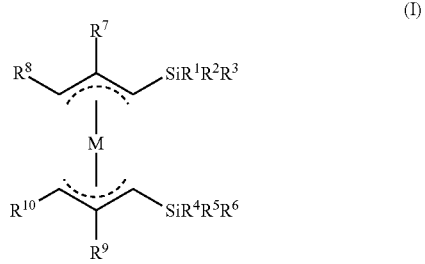

(I)

wherein M be selected from the group consisting of nickel, cobalt, iron, ruthenium and manganese; and $R^1$, $R^2$, $R^3$, $R^4$, $R^5$, $R^6$, $R^7$, $R^8$, $R^9$, and $R^{10}$ each independently may be hydrogen or $C_1$-$C_5$-alkyl.

In some embodiments, M may be selected from the group consisting of nickel, cobalt, and iron. In other embodiments, M may be selected from the group consisting of nickel, iron, ruthenium and manganese. In particular, M may be nickel.

$R^1$, $R^2$, $R^3$, $R^4$, $R^5$, $R^6$, $R^7$, $R^8$, $R^9$ and $R^{10}$, at each occurrence, can be the same or different. For example, $R^1$, $R^2$, $R^3$, $R^4$, $R^5$, $R^6$, $R^7$, $R^8$, $R^9$ and $R^{10}$ may all be hydrogen or all be an alkyl (e.g., $C_1$-$C_5$-alkyl). Additionally or alternatively, $R^1$, $R^2$, $R^3$, $R^4$, $R^5$, and $R^6$ may be the same or different. Additionally or alternatively, $R^7$, $R^8$, $R^9$, and $R^{10}$ may be the same or different.

In one embodiment, the metal complex of Formula I may be homoleptic, i.e., all the ligands attached to the metal center are the same. Alternatively, the metal complex of Formula I may be heteroleptic i.e., the ligands attached the metal center are different and/or the substitution of the ligands attached to the metal center are different.

In one embodiment, up to and including nine of $R^1$, $R^2$, $R^3$, $R^4$, $R^5$, $R^6$, $R^7$, $R^8$, $R^9$, and $R^{10}$ may each be hydrogen. For example, at least one of, at least two of, at least three of, at least four of, at least five of, at least six of, at least seven of, or at least eight of $R^1$, $R^2$, $R^3$, $R^4$, $R^5$, $R^6$, $R^7$, $R^8$, $R^9$, and $R^{10}$ may be hydrogen.

In another embodiment, at least one of $R^7$, $R^8$, $R^9$, and $R^{10}$ may be hydrogen. Additionally or alternatively, at least two of or at least three of $R^7$, $R^8$, $R^9$, and $R^{10}$ may be hydrogen. In a further embodiment, $R^7$, $R^8$, $R^9$, and $R^{10}$ may be hydrogen.

In another embodiment, at least one of $R^1$, $R^2$, $R^3$, $R^4$, $R^5$, and $R^6$ may be hydrogen. Additionally or alternatively, at least two of, at least three of, at least four of, or at least five of $R^1$, $R^2$, $R^3$, $R^4$, $R^5$, and $R^6$ may be hydrogen. In a further embodiment, $R^1$, $R^2$, $R^3$, $R^4$, $R^5$, and $R^6$ may be hydrogen.

In another embodiment, up to and including nine of $R^1$, $R^2$, $R^3$, $R^4$, $R^5$, $R^6$, $R^7$, $R^8$, $R^9$, and $R^{10}$ each independently may be an alkyl. For example, at least one of, at least two of, at least three of, at least four of, at least five of, at least six of, at least seven of, or at least eight of $R^1$, $R^2$, $R^3$, $R^4$, $R^5$, $R^6$, $R^7$, $R^8$, $R^9$, and $R^{10}$ may be an alkyl.

In another embodiment, at least one of $R^7$, $R^8$, $R^9$, and $R^{10}$ may be an alkyl. Additionally or alternatively, at least two of or at least three of $R^7$, $R^8$, $R^9$, and $R^{10}$ may be an alkyl. In a further embodiment, $R^7$, $R^8$, $R^9$, and $R^{10}$ may be an alkyl.

In another embodiment, at least one of $R^1$, $R^2$, $R^3$, $R^4$, $R^5$, and $R^6$ may be an alkyl. Additionally or alternatively, at least two of, at least three of, at least four of, or at least five of $R^1$, $R^2$, $R^3$, $R^4$, $R^5$, and $R^6$ may be an alkyl. In a further embodiment, $R^1$, $R^2$, $R^3$, $R^4$, $R^5$, and $R^6$ may be an alkyl.

The alkyl groups discussed herein can be $C_1$-$C_8$-alkyl, $C_1$-$C_7$-alkyl, $C_1$-$C_6$-alkyl, $C_1$-$C_5$-alkyl, $C_1$-$C_4$-alkyl, $C_1$-$C_3$-alkyl, $C_1$-$C_2$-alkyl or $C_1$-alkyl. In a further embodiment, the alkyl is $C_1$-$C_5$-alkyl, $C_1$-$C_4$-alkyl, $C_1$-$C_3$-alkyl, $C_1$-$C_2$-alkyl or $C_1$-alkyl. The alkyl group may be straight-chained or branch. In particular, the alkyl is straight-chained. In a further embodiment the alkyl is selected from the group consisting of methyl, ethyl, propyl, isopropyl, butyl, isobutyl, sec-butyl, tert-butyl, pentyl, and neopentyl.

In some embodiments $R^1$, $R^2$, $R^3$, $R^4$, $R^5$, $R^6$, $R^7$, $R^8$, $R^9$, and $R^{10}$ each independently may be hydrogen or $C_1$-$C_4$-alkyl. In other embodiments, $R^1$, $R^2$, $R^3$, $R^4$, $R^5$, $R^6$, $R^7$, $R^8$, $R^9$, and $R^{10}$ each independently may be hydrogen or $C_1$-$C_3$-alkyl.

In some embodiments, $R^1$, $R^2$, $R^3$, $R^4$, $R^5$ and $R^6$ each independently may be hydrogen, methyl or ethyl. In another embodiment, $R^1$, $R^2$, $R^3$, $R^4$, $R^5$ and $R^6$ each independently may be methyl or ethyl. In a particular embodiment, $R^1$, $R^2$, $R^3$, $R^4$, $R^5$ and $R^6$ may be methyl.

In another embodiment, $R^7$, $R^8$, $R^9$ and $R^{10}$ each independently may be hydrogen, methyl or ethyl. In another embodiment, $R^7$, $R^8$, $R^9$ and $R^{10}$ each independently may be hydrogen or methyl. In a particular embodiment, $R^7$, $R^8$, $R^9$ and $R^{10}$ may be hydrogen.

In some embodiments, $R^1$, $R^2$, $R^3$, $R^4$, $R^5$, $R^6$, $R^7$, $R^8$, $R^9$, and $R^{10}$ each independently may be hydrogen, methyl or ethyl. In another embodiment, $R^1$, $R^2$, $R^3$, $R^4$, $R^5$ and $R^6$ each independently may be methyl or ethyl and $R^7$, $R^8$, $R^9$ and $R^{10}$ each independently may be hydrogen, methyl or ethyl. In another embodiment, $R^1$, $R^2$, $R^3$, $R^4$, $R^5$ and $R^6$ each independently may be hydrogen, methyl or ethyl and $R^7$, $R^8$, $R^9$ and $R^{10}$ each independently may be hydrogen.

In a further embodiment, $R^1$, $R^2$, $R^3$, $R^4$, $R^5$ and $R^6$ each independently may be methyl or ethyl and $R^7$, $R^8$, $R^9$ and $R^{10}$ each independently may be hydrogen. In a particular embodiment, $R^1$, $R^2$, $R^3$, $R^4$, $R^5$ and $R^6$ each independently may be methyl and $R^7$, $R^8$, $R^9$ and $R^{10}$ each independently may be hydrogen.

In a particular embodiment, M may be nickel and $R^1$, $R^2$, $R^3$, $R^4$, $R^5$, $R^6$, $R^7$, $R^8$, $R^9$, and $R^{1'}$ each independently may be hydrogen or $C_1$-$C_4$-alkyl. Additionally or alternatively, M may be nickel and $R^1$, $R^2$, $R^3$, $R^4$, $R^5$, $R^6$, $R^7$, $R^8$, $R^9$, and $R^{10}$ each independently may be hydrogen or $C_1$-$C_3$-alkyl. Additionally or alternatively, M may be nickel and $R^1$, $R^2$, $R^3$, $R^4$, $R^5$, $R^6$, $R^8$, $R^9$, and $R^{10}$ each independently may hydrogen, methyl or ethyl.

In another embodiment, M may be nickel; $R^1$, $R^2$, $R^3$, $R^4$, $R^5$ and $R^6$ each independently may be methyl or ethyl; and $R^7$, $R^8$, $R^9$ and $R^{10}$ each independently may be hydrogen, methyl or ethyl. Additionally or alternatively, M may be nickel; $R^1$, $R^2$, $R^3$, $R^4$, $R^5$ and $R^6$ each independently may be hydrogen, methyl or ethyl; and $R^7$, $R^8$, $R^9$ and $R^{10}$ each independently may be hydrogen. Additionally or alternatively, M may be nickel; $R^1$, $R^2$, $R^3$, $R^4$, $R^5$ and $R^6$ each independently may be methyl or ethyl; and $R^7$, $R^8$, $R^9$ and $R^{10}$ each independently may be hydrogen.

Examples of metal complexes corresponding in structure to Formula I are shown in Table 1.

TABLE 1

Complexes of Formula I

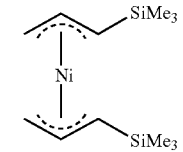 (1)

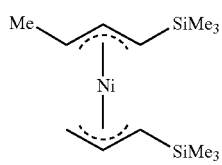 (2)

TABLE 1-continued

Complexes of Formula I

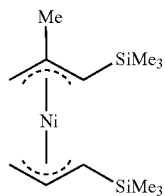 (3)

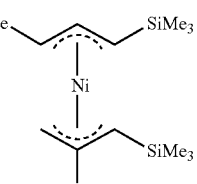 (4)

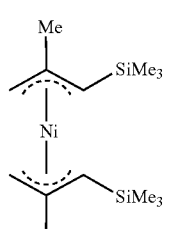 (5)

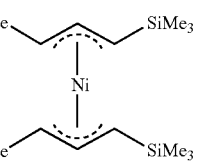 (6)

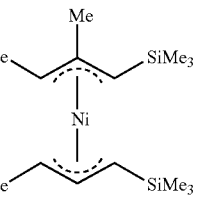 (7)

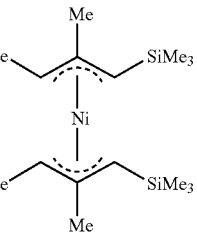 (8)

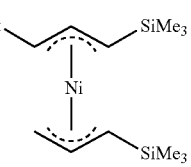 (9)

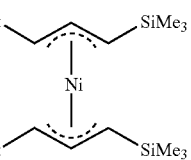 (10)

TABLE 1-continued

Complexes of Formula I

(11) tBu-CH=CH-CH₂-SiMe₃ / Ni / CH₂=CH-CH₂-SiMe₃

(12) tBu(SiMe₃)C=CH-CH₂ / Ni / CH₂=CH-CH₂-SiMe₃

(13) iPr-CH=CH-CH₂-SiMe₃ / Ni / CH₂=CH-CH₂-SiMe₃

(14) iPr(SiMe₃)C=CH-CH₂ / Ni / CH₂=CH-CH₂-SiMe₃

(15) Et-CH₂-C(Me)=CH-SiMe₃ / Ni / CH₂=CH-CH₂-SiMe₃

(16) Et-CH₂-C(Me)=CH-SiMe₃ / Ni / Et-CH₂-C(Me)=CH-SiMe₃

(17) CH₂=CH-CH₂-SiEt₃ / Ni / CH₂=CH-CH₂-SiEt₃

(18) CH₂=CH-CH₂-SiEt₃ / Ni / CH₂=CH-CH₂-SiMe₃

(19) CH₂=CH-CH₂-SiH₃ / Ni / CH₂=CH-CH₂-SiMe₃

(20) CH₂=CH-CH₂-SiH₃ / Ni / CH₂=CH-CH₂-SiH₃

(21) CH₂=CH-CH₂-SiMe₂H / Ni / CH₂=CH-CH₂-SiMe₃

(22) CH₂=CH-CH₂-SiMe₂H / Ni / CH₂=CH-CH₂-SiMe₂H

(23) CH₂=CH-CH₂-SiEtMe₂ / Ni / CH₂=CH-CH₂-SiMe₃

(24) CH₂=CH-CH₂-SiMe₃ / Co / CH₂=CH-CH₂-SiMe₃

(25) CH₂=CH-CH₂-SiMe₃ / Fe / CH₂=CH-CH₂-SiMe₃

(26) CH₂=CH-CH₂-SiMe₃ / Ru / CH₂=CH-CH₂-SiMe₃

(27) CH₂=CH-CH₂-SiMe₃ / Mn / CH₂=CH-CH₂-SiMe₃

In one embodiment, a mixture of two or more organometallic complexes of Formula I is provided.

In another embodiment, a metal complex of Formula II is provided:

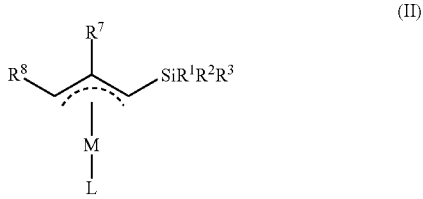

(II)

wherein M is as described herein; $R^1$, $R^2$, $R^3$, $R^7$, and $R^8$ are as described herein; and L is selected from the group consisting of hydrogen, $C_1$-$C_5$-alkyl, $(R^{11})_n$Cp, $NR^{12}R^{13}$, 3,5-$R^{14}R^{15}$—$C_3HN_2$, $Si(SiR^{16}R^{17}R^{18})_3$, and

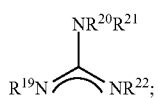

wherein Cp is cyclopentadienyl ring, n is 0-5, and $R^{11}$, $R^{12}$, $R^{13}$, $R^{14}$, $R^{15}$, $R^{16}$, $R^{17}$, $R^{18}$, $R^{19}$, $R^{20}$, $R^{21}$, and $R^{22}$ are each independently hydrogen or $C_1$-$C_5$-alkyl.

The metal complexes provided herein may be used to prepare metal-containing films such as, for example, elemental nickel, nickel oxide, nickel nitride and nickel silicide films. Thus, according to another aspect, a method of forming a metal-containing film by a vapor deposition process is provided. The method comprises vaporizing at least one organometallic complex corresponding in structure to Formula I, Formula II, or a combination thereof, as disclosed herein. For example, this may include (1) vaporizing the at least one complex and (2) delivering the at least one complex to a substrate surface or passing the at least one complex over a substrate (and/or decomposing the at least one complex on the substrate surface).

A variety of substrates can be used in the deposition methods disclosed herein. For example, metal complexes as disclosed herein may be delivered to, passed over, or deposited on a variety of substrates or surfaces thereof such as, but not limited to, silicon, crystalline silicon, Si(100), Si(111), silicon oxide, glass, strained silicon, silicon on insulator (SOI), doped silicon or silicon oxide(s) (e.g., carbon doped silicon oxides), silicon nitride, germanium, gallium arsenide, tantalum, tantalum nitride, aluminum, copper, ruthenium, titanium, titanium nitride, tungsten, tungsten nitride, and any number of other substrates commonly encountered in nanoscale device fabrication processes (e.g., semiconductor fabrication processes). As will be appreciated by those of skill in the art, substrates may be exposed to a pretreatment process to polish, etch, reduce, oxidize, hydroxylate, anneal and/or bake the substrate surface. In one or more embodiments, the substrate surface contains a hydrogen-terminated surface.

In certain embodiments, the metal complex may be dissolved in a suitable solvent such as a hydrocarbon or an amine solvent to facilitate the vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyl-dodecylamine. For example, the metal complex may be dissolved in toluene to yield a solution with a concentration from about 0.05 M to about 1 M.

In another embodiment, the at least one metal complex may be delivered "neat" (undiluted by a carrier gas) to a substrate surface.

In one embodiment, the vapor deposition process is chemical vapor deposition.

In another embodiment, the vapor deposition process is atomic layer deposition.

The ALD and CVD methods encompass various types of ALD and CVD processes such as, but not limited to, continuous or pulsed injection processes, liquid injection processes, photo-assisted processes, plasma-assisted, and plasma-enhanced processes. For purposes of clarity, the methods of the present technology specifically include direct liquid injection processes. For example, in direct liquid injection CVD ("DLI-CVD"), a solid or liquid metal complex may be dissolved in a suitable solvent and the solution formed therefrom injected into a vaporization chamber as a means to vaporize the metal complex. The vaporized metal complex is then transported/delivered to the substrate surface. In general, DLI-CVD may be particularly useful in those instances where a metal complex displays relatively low volatility or is otherwise difficult to vaporize.

In one embodiment, conventional or pulsed CVD is used to form a metal-containing film vaporizing and/or passing the at least one metal complex over a substrate surface. For conventional CVD processes see, for example Smith, Donald (1995). *Thin-Film Deposition: Principles and Practice*. McGraw-Hill.

In one embodiment, CVD growth conditions for the metal complexes disclosed herein include, but are not limited to:
   a. Substrate temperature: 50-200° C.
   b. Evaporator temperature (metal precursor temperature): 0-70° C.
   c. Reactor pressure: 0-10 Torr
   d. Argon or nitrogen carrier gas flow rate: 0-50 sccm
   e. Oxygen flow rate for ozone process: 0-300 sccm
   f. Hydrogen flow rate: 0-50 sccm
   g. Run time: will vary according to desired film thickness In another embodiment, photo-assisted CVD is used to form a metal-containing film by vaporizing and/or passing at least one metal complex disclosed herein over a substrate surface.

In a further embodiment, conventional (i.e., pulsed injection) ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131.

In another embodiment, liquid injection ALD is used to form a metal-containing film by vaporizing and/or passing at least one metal complex disclosed herein over a substrate surface, wherein at least one metal complex is delivered to the reaction chamber by direct liquid injection as opposed to vapor draw by a bubbler. For liquid injection ALD processes see, for example, Potter R. J., et al., *Chem. Vap. Deposition*, 2005, 11(3), 159-169.

Examples of ALD growth conditions for metal complexes disclosed herein include, but are not limited to:
   a. Substrate temperature: 0-275° C.
   b. Evaporator temperature (metal precursor temperature): 0-70° C.
   c. Reactor pressure: 0-10 Torr
   d. Argon or nitrogen carrier gas flow rate: 0-50 sccm
   e. Reactive gas flow rate: 0-300 sccm
   f. Pulse sequence (metal complex/purge/reactive gas/purge): will vary according to chamber size g. Number of cycles: will vary according to desired film thickness In another embodiment, photo-assisted ALD is used to form a metal-containing film by vaporizing and/or passing at least one metal complex disclosed herein over a substrate surface. For photo-assisted ALD processes see, for example, U.S. Pat. No. 4,581,249.

In another embodiment, plasma-assisted or plasma-enhanced ALD is used to form a metal-containing film by vaporizing and/or passing at least one metal complex disclosed herein over a substrate surface.

In another embodiment, a method of forming a metal-containing film on a substrate surface comprises: during an ALD process, exposing a substrate to a vapor phase metal complex according to one or more of the embodiments described herein, such that a layer is formed on the surface comprising the metal complex bound to the surface by the metal center (e.g., nickel); during an ALD process, exposing the substrate having bound metal complex with a co-reactant such that an exchange reaction occurs between the bound metal complex and co-reactant, thereby dissociating the bound metal complex and producing a first layer of elemental metal on the surface of the substrate; and sequentially repeating the ALD process and the treatment.

The reaction time, temperature and pressure are selected to create a metal-surface interaction and achieve a layer on the surface of the substrate. The reaction conditions for the ALD reaction will be selected based on the properties of the metal complex. The deposition can be carried out at atmospheric pressure but is more commonly carried out at a reduced pressure. The vapor pressure of the metal complex should be low enough to be practical in such applications. The substrate temperature should be high enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular metal complex used and the pressure. The properties of a specific metal complex for use in the ALD deposition methods disclosed herein can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

A metal complex for use in the deposition methods will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Thus, the metal complexes disclosed herein utilized in these methods may be liquid, solid, or gaseous. Typically, the metal complexes are liquids or solids at ambient temperatures with a vapor pressure sufficient to allow for consistent transport of the vapor to the process chamber.

In one embodiment, an elemental metal, a metal nitride, a metal oxide, or a metal silicide film can be formed by delivering for deposition at least one metal complex as disclosed herein, independently or in combination with a co-reactant. In this regard, the co-reactant may be deposited or delivered to or passed over a substrate surface, independently or in combination with the at least one metal complex. As will be readily appreciated, the particular co-reactant used will determine the type of metal-containing film is obtained. Examples of such co-reactants include, but are not limited to hydrogen, hydrogen plasma, oxygen, air, water, an alcohol, $H_2O_2$, $N_2O$, ammonia, a hydrazine, a borane, a silane, ozone, or a combination of any two or more thereof. Examples of suitable alcohols include, without limitation, methanol, ethanol, propanol, isopropanol, tert-butanol, and the like. Examples of suitable boranes include, without limitation, hydridic (i.e., reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$), a hydrazine optionally substituted with one or more alkyl groups (i.e., an alkyl-substituted hydrazine) such as methylhydrazine, tert-butylhydrazine, N,N- or N,N'-dimethylhydrazine, a hydrazine optionally substituted with one or more aryl groups (i.e., an aryl-substituted hydrazine) such as phenylhydrazine, and the like.

In one embodiment, the metal complexes disclosed herein are delivered to the substrate surface in pulses alternating with pulses of an oxygen-containing co-reactant as to provide metal oxide films. Examples of such oxygen-containing co-reactants include, without limitation, $H_2O$, $H_2O_2$, $O_2$, ozone, air, i-PrOH, t-BuOH, or $N_2O$.

In other embodiments, a co-reactant comprises a reducing reagent such as hydrogen. In such embodiments, an elemental metal film is obtained. In particular embodiments, the elemental metal film consists of, or consists essentially of, pure metal. Such a pure metal film may contain more than about 80, 85, 90, 95, or 98% metal. In even more particular embodiments, the elemental metal film is a nickel film.

In other embodiments, a co-reactant is used to form a metal nitride film by delivering for deposition at least one metal complex as disclosed herein, independently or in combination, with a co-reactant such as, but not limited to, ammonia, a hydrazine, and/or other nitrogen-containing compounds (e.g., an amine) to a reaction chamber. A plurality of such co-reactants may be used. In further embodiments, the metal nitride film is a nickel nitride film.

In another embodiment, a mixed-metal film can be formed by a vapor deposition process which vaporizes at least one metal complex as disclosed herein in combination, but not necessarily at the same time, with a second metal complex comprising a metal other than that of the at least one metal complex disclosed herein.

In a particular embodiment, the methods of the present technology are utilized for applications such as dynamic random access memory (DRAM) and complementary metal oxide semi-conductor (CMOS) for memory and logic applications, on substrates such as silicon chips.

Any of the metal complexes disclosed herein may be used to prepare thin films of the elemental metal, metal oxide, metal nitride, and/or metal silicide. Such films may find application as oxidation catalysts, anode materials (e.g., SOFC or LIB anodes), conducting layers, sensors, diffusion barriers/coatings, super- and non-superconducting materials/coatings, tribological coatings, and/or, protective coatings. It is understood by one of ordinary skill in the art that the film properties (e.g., conductivity) will depend on a number of factors, such as the metal(s) used for deposition, the presence or absence of co-reactants and/or co-complexes, the thickness of the film created, the parameters and substrate employed during growth and subsequent processing.

Fundamental differences exist between the thermally-driven CVD process and the reactivity-driven ALD process. The requirements for precursor properties to achieve optimum performance vary greatly. In CVD a clean thermal decomposition of the complex to deposit the required species onto the substrate is critical. However, in ALD such a thermal decomposition is to be avoided at all costs. In ALD, the reaction between the input reagents must be rapid at the surface resulting in formation of the target material on the substrate. However, in CVD, any such reaction between species is detrimental due to their gas phase mixing before reaching the substrate, which could lead to particle formation. In general it is accepted that good CVD precursors do not necessarily make good ALD precursors due to the relaxed thermal stability requirement for CVD precursors. In this invention, Formula I metal complexes possess enough thermal stability and reactivity toward select co-reactants to function as ALD precursors, and they possess clean decomposition pathways at higher temperatures to form desired materials through CVD processes as well. Therefore, the metal complexes described by Formula I are advantageously useful as viable ALD and CVD precursors.

Additionally, carbon concentration present in the thin films produced by the ALD and CVD methods described herein can be effectively controlled by using the metal complexes of Formula I, particularly the nickel containing complexes. Advantageously, the amount of carbon concentration in the thin film may be increased or decreased in a wide range by adjusting the temperature during the ALD and/or CVD method. Typically, carbon incorporation in a thin film should be avoided as it may change the conductivity of the film and degrade device performance. However, higher carbon concentration in the thin films (e.g., nickel containing thin films) produced by the methods described herein may beneficially increase performance and function of the thin film in certain electronics applications. For example, during CVD, the at least one metal complex (e.g., nickel complex) may be vaporized at temperatures of about 50° C. to about 70° C. producing a metal-containing film having a carbon concentration of about $1\times10^{21}$ atoms per cubic centimeter (atoms/cm$^3$) to about $2\times10^{22}$ atoms/cm$^3$. Alternatively, during ALD, the at least one metal complex (e.g., nickel complex) may be vaporized at temperatures of about 50° C. to about 70° C. producing a metal-containing film having a carbon concentration of about $5\times10^{19}$ atoms/cm$^3$ to about $5\times10^{21}$ atoms/cm$^3$. In particular, carbon concentration may increase as temperature decreases during the ALD or CVD method.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

The invention can additionally or alternatively include one or more of the following embodiments.

Embodiment 1

A metal complex corresponding in structure to Formula I:

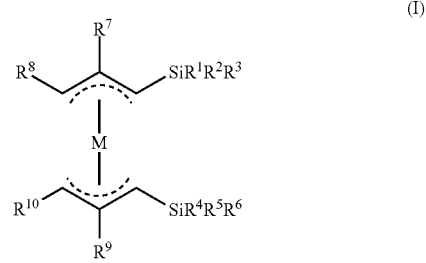

wherein M is selected from the group consisting of nickel, cobalt, iron, ruthenium and manganese, preferably M is nickel; and $R^1$, $R^2$, $R^3$, $R^4$, $R^5$, $R^6$, $R^7$, $R^8$, $R^9$, and $R^{10}$ are each independently hydrogen or $C_1$-$C_5$-alkyl, preferably hydrogen or $C_1$-$C_4$-alkyl, more preferably hydrogen, methyl or ethyl.

Embodiment 2

The metal complex of embodiment 1, wherein M is selected from the group consisting of nickel, cobalt, iron, ruthenium and manganese, preferably M is nickel; $R^1$, $R^2$, $R^3$, $R^4$, $R^5$, and $R^6$ are each independently methyl or ethyl; and $R^7$, $R^8$, $R^9$, and $R^{10}$ are each independently hydrogen, methyl or ethyl, preferably hydrogen.

Embodiment 3

The metal complex of embodiment 1 or 2, wherein $R^1$, $R^2$, $R^3$, $R^4$, $R^5$, and $R^6$ are the same.

Embodiment 4

The metal complex of any one of the previous embodiments, wherein the complex is homoleptic.

Embodiment 5

The metal complex of any one of the previous embodiments, wherein the complex is:

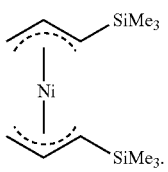

Embodiment 6

A metal complex corresponding in structure to Formula II:

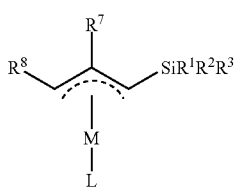

(II)

wherein M is selected from the group consisting of nickel, cobalt, iron, ruthenium and manganese, preferably M is nickel; and $R^1$, $R^2$, $R^3$, $R^7$, and $R^8$, are each independently hydrogen or $C_1$-$C_5$-alkyl, preferably hydrogen or $C_1$-$C_4$-alkyl, more preferably hydrogen, methyl or ethyl.

Embodiment 7

The metal complex of embodiment 6, wherein M is selected from the group consisting of nickel, cobalt, iron, ruthenium and manganese, preferably M is nickel; $R^1$, $R^2$, and $R^3$ are each independently methyl or ethyl; and $R^7$ and $R^8$ are each independently hydrogen, methyl or ethyl, preferably hydrogen.

Embodiment 8

The metal complex of embodiment 6 or 7, wherein $R^1$, $R^2$, and $R^3$ are the same.

Embodiment 9

The metal complex of any one of embodiment 6, 7, or 8, wherein the complex is homoleptic.

Embodiment 10

A method of forming a metal-containing film by a vapor deposition process, the method comprising vaporizing at least one metal complex according to any one of the previous embodiments.

Embodiment 11

The method of embodiment 10, wherein the vapor deposition process is chemical vapor deposition, preferably pulsed chemical vapor deposition, continuous flow chemical vapor deposition, and/or liquid injection chemical vapor deposition.

Embodiment 12

The method of embodiment 11, wherein the at least one metal complex, preferably wherein M is nickel, is vaporized at a temperature of about 50° C. to about 70° C. and the metal-containing film has a carbon concentration of about $1 \times 10^{21}$ atoms per cubic centimeter to about $2 \times 10^{22}$ atoms per cubic centimeter.

Embodiment 13

The method of embodiment 10, wherein the vapor deposition process is atomic layer deposition, preferably liquid injection atomic layer deposition or plasma-enhanced atomic layer deposition.

Embodiment 14

The method of embodiment 13, wherein the at least one metal complex, preferably wherein M is nickel, is vaporized at a temperature of about 50° C. to about 70° C. and the metal-containing film has a carbon concentration of about $5 \times 10^{19}$ atoms per cubic centimeter to about $5 \times 10^{21}$ atoms per cubic centimeter.

Embodiment 15

The method of any one of embodiments 10, 11, 12, 13 or 14, wherein the metal complex is delivered to a substrate in pulses alternating with pulses of an oxygen source, preferably the oxygen source is selected from the group consisting of $H_2O$, $H_2O_2$, $O_2$, ozone, air, i-PrOH, t-BuOH, and $N_2O$.

Embodiment 16

The method of any one of embodiments 10, 11, 12, 13, 14 or 15 further comprising vaporizing at least one co-reactant selected from the group consisting of hydrogen, hydrogen plasma, oxygen, air, water, ammonia, a hydrazine, a borane, a silane, ozone, and a combination of any two or more thereof, preferably the at least one co-reactant is a hydrazine (e.g., hydrazine ($N_2H_4$), N,N-dimethylhydrazine).

Embodiment 17

The method of any one of embodiments 10, 11, 12, 13, 14, 15 or 16, wherein the method is used for a DRAM or CMOS application.

EXAMPLES

Unless otherwise noted, all synthetic manipulations are performed under an inert atmosphere (e.g., purified nitrogen or argon) using techniques for handling air-sensitive materials commonly known in the art (e.g., Schlenk techniques).

Example 1: Preparation of complex 1 (bis-(1-trimethylsilylallyl)nickel(II)) (Ni(TMS-allyl)$_2$)

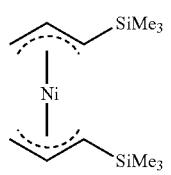

1

Step 1: Preparation of K-Trimethylsilylallyl

A 500 mL Schlenk flask was charged with allyltrimethylsilane (26.0 g, 230 mmol) and 200 mL of anhydrous hexane to form a solution. The solution was cooled to −78° C. and a 1.6 M solution of n-butyl lithium in hexane (143.75 mL, 230 mmol) was added dropwise at −78° C. to form a reaction mixture. The reaction mixture turned into a light yellow color. After stirring for ~30 minutes at −78° C., the reaction mixture was warmed to room temperature (~18° C. to ~25° C.) and stirred for another 4 to 5 hours to form a pale yellow clear solution. Potassium tert-butoxide (33.6 g, 299 mmol) was added under $N_2$ to the solution, which was stirred overnight (~6 hours to ~12 hours) at room temperature. A light yellow precipitate was formed. The precipitate was filtered through a sintered funnel in a glove box, washed by pentane several times and dried overnight (~6 hours to ~12 hours) and an off-white (light yellow) product, K-trimethylsilylally, was obtained with a yield of 33 g and characterized by $^1H$ NMR in $C_6D_6$.

Step 2

A 500 mL Schlenk flask was charged with $NiBr_2.1,2$-dimethoxyethane (10 g, 32.4 mmol) and 150 mL of anhydrous tetrahydrofuran (THF). A 100 mL THF solution of K-trimethylsilylallyl (10 g, 65.8 mmol) was added dropwise at −78° C. to form a reaction mixture. The reaction mixture was warmed to room temperature (~18° C. to ~25° C.) slowly and stirred overnight (~6 hours to ~12 hours) under $N_2$. After the solvent was removed, the residue was extracted by pentane. Removal of pentane generated a crude product as a dark brown liquid (7.3 g, 75.5%). Distillation of the crude product was performed at 80° C. at 1.5 Torr to produce 6 g of Ni(TMS-allyl)$_2$ as an orange liquid (62.1%). Elemental analysis was determined for $C_{12}H_{26}Si_2Ni$: C, 50.54; H, 9.19. Found: C, 47.88; H, 8.91.

Thermogravimetric Analysis (TGA) was performed on Ni(TMS-allyl)$_2$ and the results are provided in FIG. 1. The TGA data was obtained at up to 600° C. at a heating rate of 10° C./min under atmospheric pressure with $N_2$ as a carrier gas. TGA sampling was carried out inside an argon-filled glove-box to avoid air contact. As shown in FIG. 1, Ni(TMS-allyl)$_2$ exhibited a single weight loss (~80%) which began at about 60° C. and completed at about 300° C.

Example 2: ALD and Pulsed CVD Growth of NiO and Ni Films

General Methods

Ni(TMS-allyl)$_2$ was heated to 50° C. in a stainless steel bubbler, or 60-70° C. in a vapor draw ampule, delivered into an ALD/CVD reactor using nitrogen as a carrier gas and deposited by ALD or pulsed CVD. Ozone ($O_3$) was generated at room temperature in-situ from oxygen gas and delivered into the ALD/CVD reactor through a needle valve as a co-reactant. The $O_3$ concentration was monitored and maintained at ~200 g/m$^3$. The substrates used were: silicon chips having a native $SiO_2$ layer in the range of 14-17 Å thick when used for thickness measurement, XPS (X-ray Photoelectron Spectroscopy) and SIMS (Secondary Ion Mass Spectroscopy) analysis; or ~1 kÅ thick thermal $SiO_2$ when used for resistivity measurements. $H_2O$ was delivered from a stainless steel ampule through a needle valve at room temperature. Other gaseous co-reactants, $H_2$, $NH_3$, $N_2O$ or $O_2$, were delivered through a needle valve from compressed gas cylinders. As-deposited films were used for thickness and optical property measurements using an optical ellipsometer, and for sheet resistance measurements using a four-point probe. XPS and SIMS element analyses were performed at various film depths for selected samples. Reported XPS and SIMS data were obtained after a surface layer of a NiO film was sputtered away or removed in order to analyze the film substantially free of surface contaminants which may be present due to air exposure.

Example 2a: ALD Growth with $H_2$, with $NH_3$, and without Co-Reactant

Ni(TMS-allyl)$_2$ was delivered into an ALD/CVD reactor using 20 sccm of nitrogen as the carrier gas, and pulsed for 5 seconds from a bubbler followed by a 10-20 second purge, and deposited at multiple temperatures from 200° C. to 275° C. for up to 280 cycles, either without a co-reactant or with a 5-10 second pulse of a reducing gas, $H_2$ or $NH_3$, and followed by a 10-20 second purge using 20 sccm of nitrogen. As-deposited films were cooled down in the reactor to ~50° C. under nitrogen purge before unloading. Film thickness up to ~580 Å was deposited. Growth rate per cycle data were plotted in FIG. 1. Conductive films with various resistivities were obtained. A low resistivity in the range of 270-920 μΩ-cm was achieved from as-deposited films when no co-reactant was used at 250° C.

As shown, FIG. 1 the TGA thermal decomposition temperature of Ni(TMS-allyl)$_2$ was ~160° C.

Example 2b: ALD Growth with $H_2O$ Co-Reactant

Figure 2:
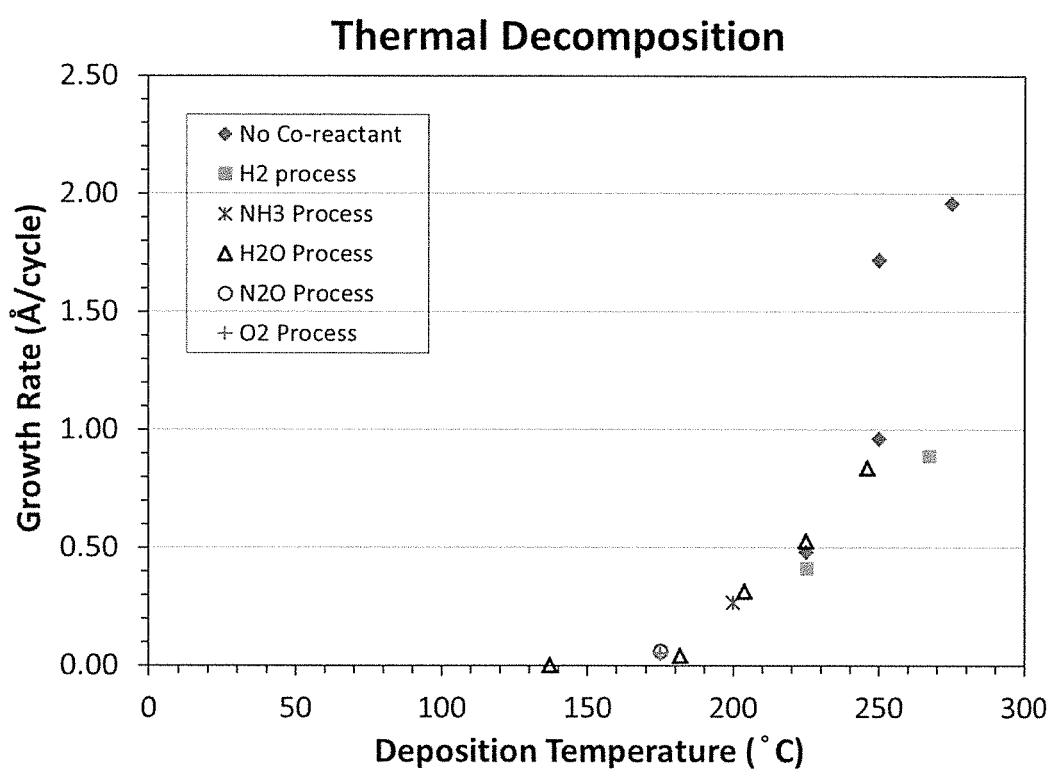
FIG. 2 illustrates dependence of ALD growth rate per cycle on the deposition temperature without a co-reactant and with various reducing and oxidizing co-reactants when depositing Ni(TMS-allyl)$_2$.

Ni(TMS-allyl)$_2$ was delivered into an ALD/CVD reactor using 10-20 sccm of nitrogen as the carrier gas, pulsed for 1-2 seconds from a vapor draw ampule, followed by a 8-15 second purge, then 1 second pulse of $H_2O$ and a 15-17 second purge, and deposited at temperatures from 137 to 268° C. for up to 400 cycles. The growth rate per cycle was almost 0 at ~180° C. or lower and increased rapidly with increasing deposition temperature, following a similar trend with the no co-reactant process as shown in FIG. 2. Selected films were analyzed by XPS to determine their composition as shown in Table 1. XPS of 225° C.- and 246° C.-deposited films revealed that they were predominantly Ni metal as determined by their binding energy, as well as some NiO and ≤6% Si impurity but had no carbon or nitrogen.

TABLE 1

XPS Data of Films deposited in ALD mode using $H_2O$ as co-reactant

| Run # | Deposition Temp. (° C.) | Thickness (Å) | Ni (atomic %) | O (atomic %) | Si (atomic %) | C (atomic %) | N (atomic %) |
|---|---|---|---|---|---|---|---|
| 4 | 225 | 201 | 59 | 35 | 6 | 0 | 0 |
| 6 | 246 | 270 | 67 | 30 | 3 | 0 | 0 |

Example 2c: ALD Growth with N₂O and O₂ Co-Reactants

Ni(TMS-allyl)₂ was delivered into an ALD/CVD reactor using 20 sccm of nitrogen as the carrier gas, pulsed for 5 seconds from a bubbler, and followed by a 11 second purge, then 10 second pulse of N₂O or O₂ through a needle valve, purged for 14 seconds, and deposited at 175° C. for 300 cycles. The growth rate per cycle, about ≤0.05 Å/cycle, was also plotted in FIG. 2. It was similar to the H₂O process at ~180° C., indicating little thermal decomposition or minimal oxidation by these oxidizers at 175° C.

Example 2d: ALD Growth with O₃ Co-Reactant

Figure 3:
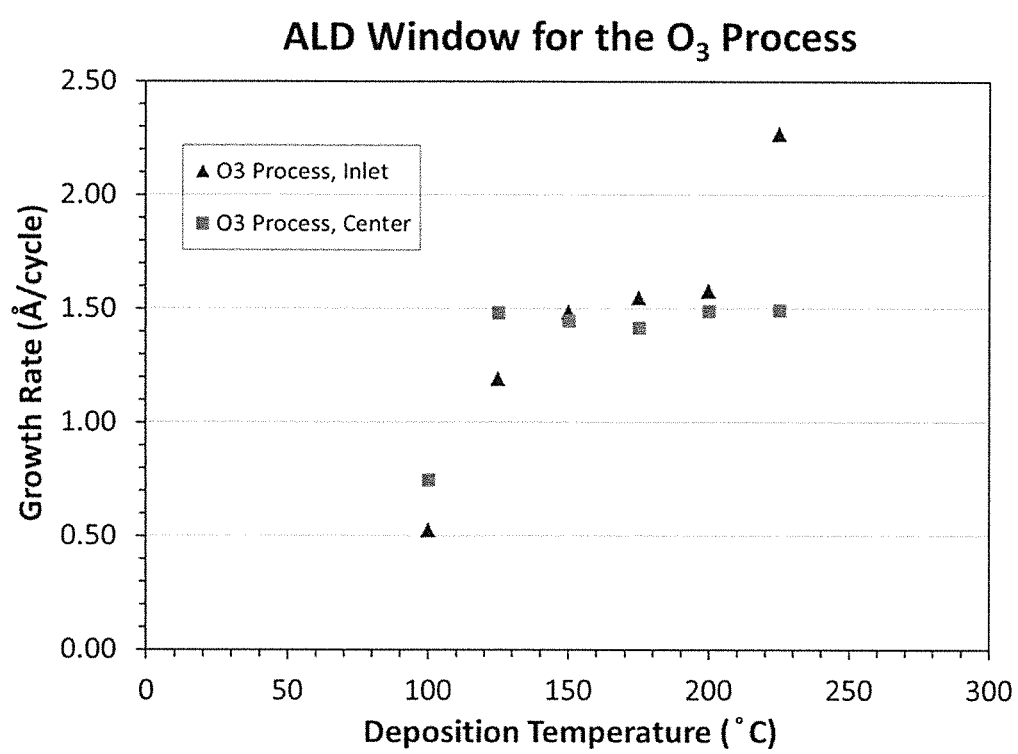
FIG. 3 illustrates dependence of growth rate of ALD grown NiO films deposited from Ni(TMS-allyl)$_2$ with ozone on the deposition temperature.

Ni(TMS-allyl)₂ was delivered into an ALD/CVD reactor using 20 sccm of nitrogen as the carrier gas, pulsed for 5 seconds from a bubbler, and followed by a 20-30 second purge, then 10 second pulse of ozone through a needle valve, purged for 14 seconds, and deposited at 100-225° C. for up to 275 cycles. The saturated temperature-dependent growth rate per cycle data are plotted in FIG. 3. An ALD window was observed, from ~125° C. to ~200° C., where the growth rate was almost a constant at ~1.5 Å/cycle, significantly higher than that from many other known Ni precursors (≤1 Å/cycle) such as Ni(acac)₂, Ni(thd)₂, and Ni(EtCp)₂. See Varun Sharma, Master Thesis "Evaluation of Novel Metalorganic Precursors for Atomic Layer Deposition of Nickel-based Thin Films", Technische Univerisitit Dresden, 2015, p. 15. The upper limit of the ALD window is higher than the TGA thermal decomposition temperature (~160° C.) due to a very short contact time for the precursor in an ALD/CVD reactor, and is also consistent with the thermal decomposition data on Si substrates shown in FIG. 1.

Figure 4:
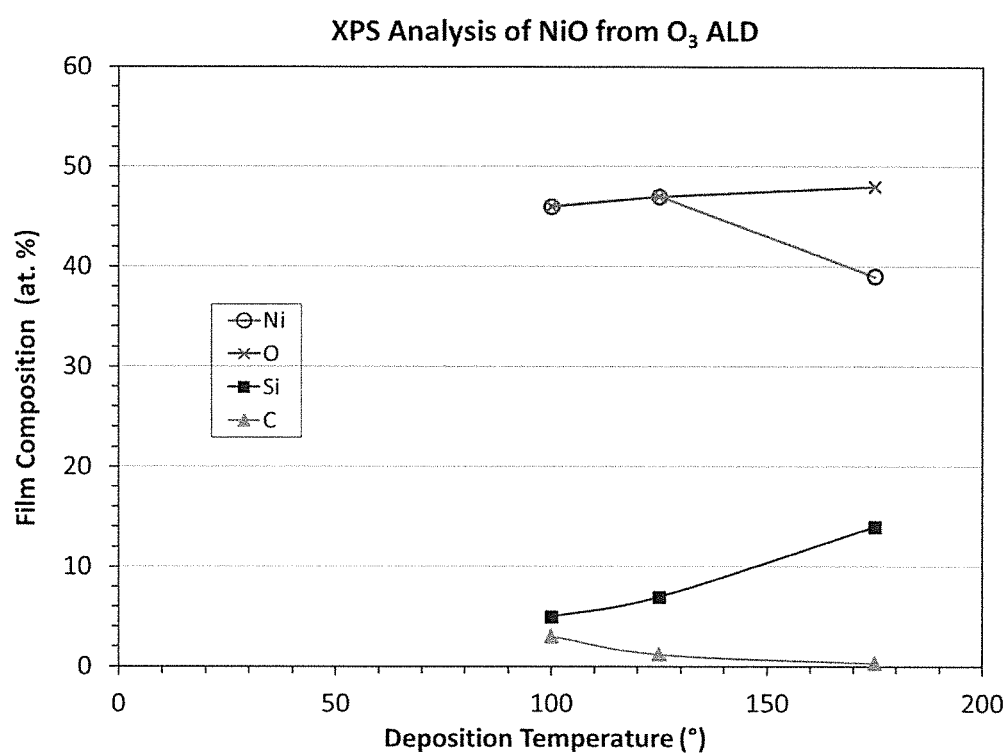
FIG. 4 illustrates dependence of chemical composition of ALD grown NiO films deposited from Ni(TMS-allyl)$_2$ with ozone on the deposition temperature.

XPS data of selected ALD NiO films are plotted in FIG. 4. The Ni/O ratio of films deposited from Ni(TMS-allyl)₂ and ozone as a function of the deposition temperature indicates near stoichiometric NiO film (Ni/O=1) when deposited at 100-125° C. There are small amounts of Si and C in the films that have opposite trends with the deposition temperature. The C concentration increases with decreasing deposition temperature as expected from the decreasing oxidizing power of O₃. On the other hand, the Si concentration in NiO in the ALD window goes up with increasing temperature and is also higher than that found in NiO from the H₂O process at ≥225° C. as listed in Table 1, where the process is predominantly thermal decomposition.

Example 2e: Pulsed CVD

Figure 5:
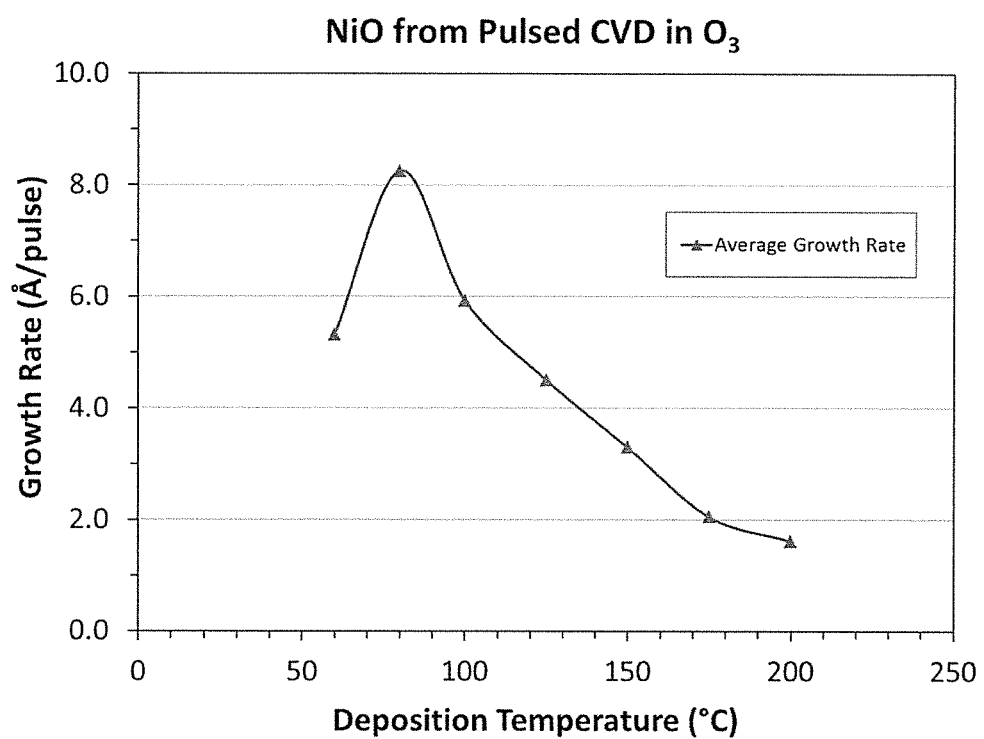
FIG. 5 illustrates dependence of average growth rate of pulsed CVD grown NiO films deposited from Ni(TMS-allyl)$_2$ with ozone on the deposition temperature.

In a pulsed CVD process, Ni(TMS-allyl)₂ was delivered into an ALD/CVD reactor using 30 sccm of nitrogen as the carrier gas, pulsed for 3 seconds from a bubbler, followed by a 12 second purge in a continuous flow of ozone at 120-220 mTorr partial pressure, and deposited at 60-200° C. for up to 200 pulses. The growth rate of NiO using the same dose of Ni(TMS-allyl)₂ increased rapidly with decreasing deposition temperature as shown in FIG. 5, which may be due to increased adsorption of the precursor on the substrate surface. The drop in growth rate at 60° C. may be due to reduced reactivity between Ni(TMS-allyl)₂ and O₃ at this temperature.

Example 2f: Comparison of ALD and Pulsed CVD NiO Films

Figure 6:
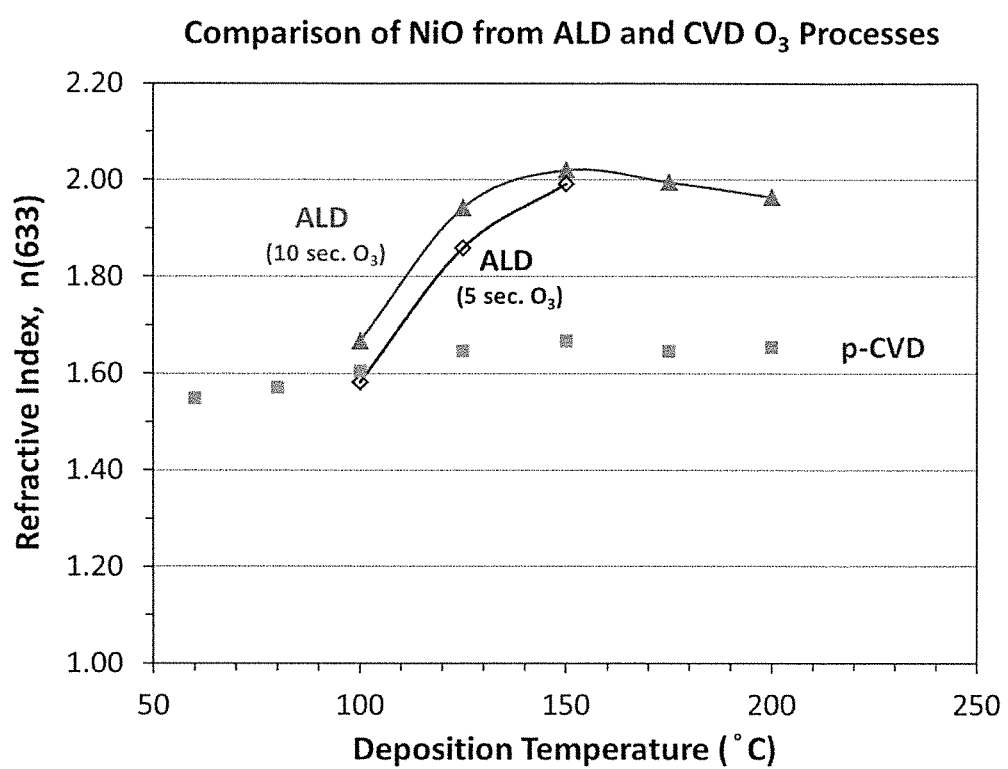
FIG. 6 illustrates a comparison of the real part of refractive index of ALD and pulsed CVD NiO films deposited from Ni(TMS-allyl)$_2$ as a function of the deposition temperature.
Figure 7:
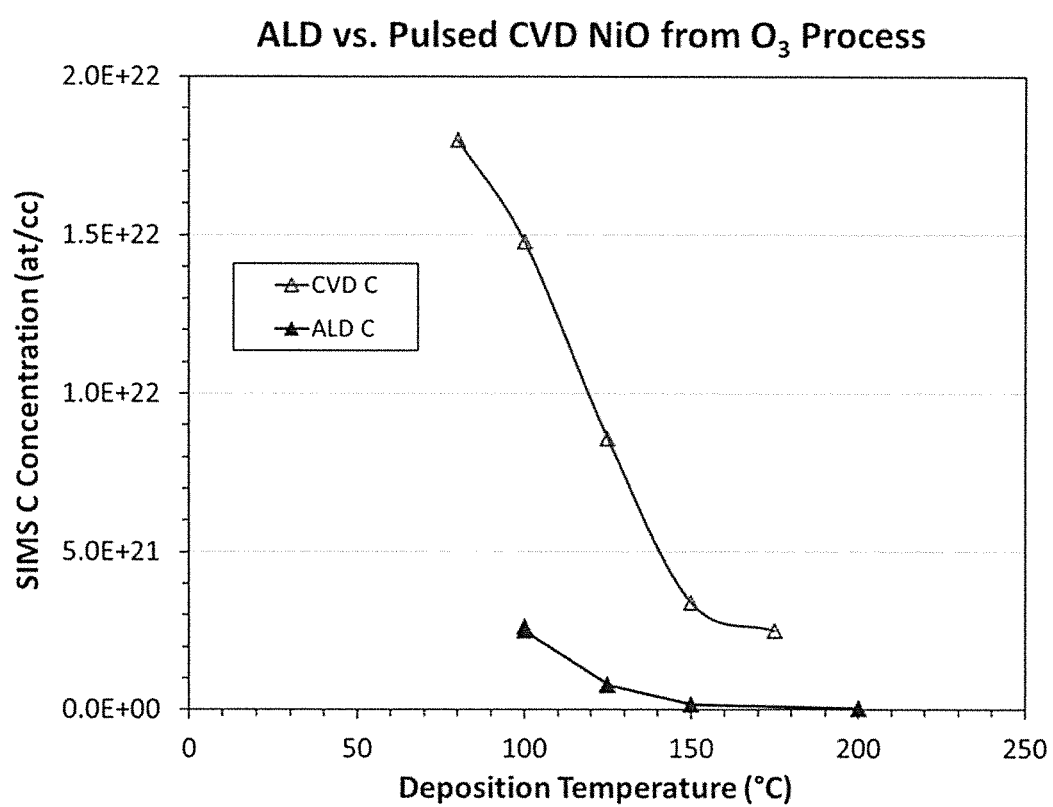
FIG. 7 illustrates a comparison of the carbon concentration in ALD and pulsed CVD NiO films deposited from Ni(TMS-allyl)$_2$ by SIMS analysis as a function of the deposition temperature.

The real part of the refractive index at 633 nm, n(633), of NiO films deposited by ALD and pulsed CVD was determined by ellipsometry and the values are compared in FIG. 6. There is a difference in the trend especially at higher temperatures. An ALD NiO film has a significantly higher n(633) when deposited within the ALD window at ≥125° C., while n(633) of the pulsed CVD film is lower and less variable than the ALD process. SIMS analysis results as shown in FIG. 7 revealed a greater difference in the carbon concentration between the ALD and pulsed CVD NiO.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

What is claimed is:

1. A metal complex corresponding in structure to Formula I:

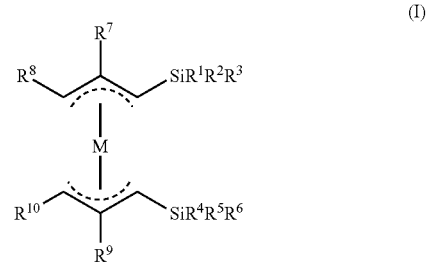

wherein
M is selected from the group consisting of nickel, cobalt, iron, ruthenium and manganese; and
$R^1$, $R^2$, $R^3$, $R^4$, $R^5$, $R^6$, $R^7$, $R^8$, $R^9$, and $R^{10}$ are each independently hydrogen or $C_1$-$C_5$-alkyl.

2. The metal complex of claim 1, wherein $R^1$, $R^2$, $R^3$, $R^4$, $R^5$, $R^6$, $R^7$, $R^8$, $R^9$, and $R^{10}$ are each independently hydrogen, methyl or ethyl.

3. The metal complex of claim 1, wherein $R^1$, $R^2$, $R^3$, $R^4$, $R^5$, and $R^6$ are each independently methyl or ethyl; and $R^7$, $R^8$, $R^9$, and $R^{10}$ are each independently hydrogen, methyl or ethyl.

4. The metal complex of claim 1, wherein M is nickel; and $R^1$, $R^2$, $R^3$, $R^4$, $R^5$, $R^6$, $R^7$, $R^8$, $R^9$, and $R^{10}$ are each independently hydrogen, methyl or ethyl.

5. The metal complex of claim 1, wherein the complex is:

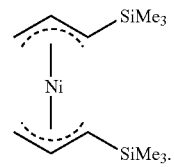

6. A method of forming a metal-containing film by a vapor deposition process, the method comprising vaporizing at least one metal complex corresponding in structure to Formula I:

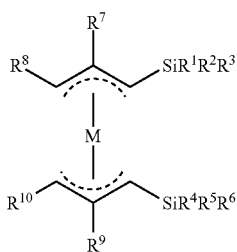

(I)

wherein
M is selected from the group consisting of nickel, cobalt, iron, ruthenium and manganese; and
$R^1$, $R^2$, $R^3$, $R^4$, $R^5$, $R^6$, $R^7$, $R^8$, $R^9$, and $R^{10}$ are each independently hydrogen or $C_1$-$C_5$-alkyl.

7. The method of claim 6, wherein $R^1$, $R^2$, $R^3$, $R^4$, $R^5$, $R^6$, $R^7$, $R^8$, $R^9$, and $R^{10}$ are each independently hydrogen, methyl or ethyl.

8. The method of claim 6, wherein $R^1$, $R^2$, $R^3$, $R^4$, $R^5$, and $R^6$ are each independently methyl or ethyl; and $R^7$, $R^8$, $R^9$, and $R^{10}$ are each independently hydrogen, methyl or ethyl.

9. The method of claim 6, wherein M is nickel; and $R^1$, $R^2$, $R^3$, $R^4$, $R^5$, $R^6$, $R^7$, $R^8$, $R^9$, and $R^{10}$ are each independently hydrogen, methyl or ethyl.

10. The method of claim 6, wherein the complex is:

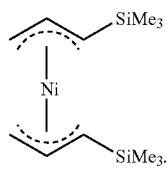

11. The method of claim 6, wherein the vapor deposition process is chemical vapor deposition or atomic layer deposition.

12. The method of claim 11, wherein the chemical vapor deposition is pulsed chemical vapor deposition, continuous flow chemical vapor deposition, or liquid injection chemical vapor deposition.

13. The method of claim 11, wherein the vapor deposition process is chemical vapor deposition and wherein the at least one metal complex is vaporized at a temperature of about 50° C. to about 70° C. and the metal-containing film has a carbon concentration of about $1\times10^{21}$ atoms per cubic centimeter to about $2\times10^{22}$ atoms per cubic centimeter.

14. The method of claim 11, wherein M is nickel.

15. The method of claim 11, wherein the atomic layer deposition is liquid injection atomic layer deposition or plasma-enhanced atomic layer deposition.

16. The method of claim 11, wherein the vapor deposition process is atomic layer deposition and the at least one metal complex is vaporized at a temperature of about 50° C. to about 70° C. and the metal-containing film has a carbon concentration of about $5\times10^{19}$ atoms per cubic centimeter to about $5\times10^{21}$ atoms per cubic centimeter.

17. The method of claim 16, wherein M is nickel.

18. The method of claim 6, wherein the metal complex is delivered to a substrate in pulses alternating with pulses of an oxygen source, wherein the oxygen source is selected from the group consisting of $H_2O$, $H_2O_2$, $O_2$, ozone, air, i-PrOH, t-BuOH, and $N_2O$.

19. The method of claim 6, further comprising vaporizing at least one co-reactant selected from the group consisting of hydrogen, hydrogen plasma, oxygen, air, water, ammonia, a hydrazine, a borane, a silane, ozone, and a combination of any two or more thereof.

20. The method of claim 19, wherein the hydrazine is hydrazine ($N_2H_4$) or N,N-dimethylhydrazine.

* * * * *